United States Patent [19]
Nagata et al.

[11] Patent Number: 5,399,448
[45] Date of Patent: Mar. 21, 1995

[54] REFLECTION MASK FOR X RAY

[75] Inventors: Hiroshi Nagata, Tokyo; Katsuhiko Murakami, Kawasaki; Hiroshi Nakamura, Tokyo, all of Japan

[73] Assignee: Nikon Corporation, Tokyo, Japan

[21] Appl. No.: 953,246

[22] Filed: Sep. 30, 1992

[30] Foreign Application Priority Data

Nov. 11, 1991 [JP] Japan .................. 3-294331

[51] Int. Cl.$^6$ .................................. G03F 9/00
[52] U.S. Cl. ............................ 430/5; 430/321
[58] Field of Search ......................... 430/5, 321

[56] References Cited

U.S. PATENT DOCUMENTS

| | | | |
|---|---|---|---|
| 5,045,417 | 9/1991 | Okamoto | 430/5 |
| 5,130,213 | 7/1992 | Berger et al. | 430/5 |
| 5,190,836 | 3/1993 | Nakagawa et al. | 430/5 |

FOREIGN PATENT DOCUMENTS

0447132  9/1991  European Pat. Off. .

OTHER PUBLICATIONS

Kinoshita, H. et al, "Soft X-Ray Reduction Lithography Using Multilayer Mirrors," J. Vac. Sci. Technol., B7(6), Nov./Dec. 1989, pp. 1648–1651.

*Primary Examiner*—Mark A. Chapman
*Attorney, Agent, or Firm*—Shapiro and Shapiro

[57] ABSTRACT

In reflection mask for X ray having a predetermined pattern formed by reflecting portions comprising multilayer film and a non-reflecting portion, the reflecting portions are designed for generating a phase difference between reflected lights from opposite sides of the non-reflecting portion.

20 Claims, 3 Drawing Sheets

REFLECTION MASK FOR X RAY

BACKGROUND OF THE INVENTION

1. Field of the Invention

This invention relates to the reproduction of an optical image, and particularly to a reflection mask for X ray illuminated by reflected illumination having the wavelength (about 2–100 nm) of a soft X ray range.

2. Related Background Art

A mask used for photoetching or the like has heretofore been formed with a predetermined pattern comprising reflecting portions and non-reflecting portions for illuminating light. This pattern has been projected onto the surface of photosensitive film by a mirror optical system (see, for example, J. Vac. Sci. Technol. B7 (1989), p. 1648).

It is known that when a pattern provided on such a projected type reflection mask (hereinafter referred to as the reflection mask) is projected by a mirror, there is a limit of resolution in the projected reproduced image due to a diffraction phenomenon. In this case, a cut-off frequency as an ideal limit value is $2 NA/\lambda$ (lines/mm) for incoherent illumination and $NA/\lambda$ (lines/mm) for coherent illumination when the numerical aperture of the projection mirror is NA and the wavelength of illuminating light used is $\lambda$. Accordingly, to enhance the resolution for illuminating light having a certain wavelength, it has been necessary to make the numerical aperture NA of the projection mirror great.

Generally, however, a mirror optical system is greater in aberration than a lens optical system and if the numerical aperture thereof is made greater than a certain value, the expanse of an image by aberration will exceed the resolution limit by diffraction. Therefore, even if an attempt is made to make the numerical aperture of the mirror system in order to a desired resolution, the magnitude of the numerical aperture has been limited.

FIG. 6 of the accompanying drawings shows a schematic cross-section of a prior-art reflection mask (for visible light) and the state of the amplitude distribution of the light of a projected image by this reflection mask. As shown, in the projected image of a prior-art ordinary reflection mask 9, comprising reflecting portions 1 and non-reflecting portions 2 alternately arranged on a base plate 8, the light from the reflecting portions 1 spreads to the regions corresponding to the non-reflecting portions 2 due to a diffraction phenomenon. Therefore, there is created a limit in the spacing $\Delta$ between the reflecting portions 1 which can be discriminated. Such a phenomenon is to be found not only in visible light but also in X ray. Therefore, a similar problem has also arisen in a reflection mask for X ray.

SUMMARY OF THE INVENTION

It is the object of the present invention to solve the above problem and, more particularly, to provide a reflection mask for X ray which can enhance the resolution limit more than in the prior art while using X ray of the same wavelength as in the prior art and the same projection mirror as in the prior art.

To achieve the above object, according to the present invention, in a reflection mask for X ray having a predetermined pattern formed by reflecting portions comprising multilayer film and a non-reflecting portion, there is provided phase shifting means for generating a phase difference between reflected lights from reflecting portions on the opposite sides of the non-reflecting portion.

The interaction of X rays (hereinafter simply referred to as light) from the adjacent reflecting portions as previously described is the superposition of the intensities of light when illuminating light is incoherent, whereas it is the superposition of the amplitudes of light when the illuminating light is coherent. The intensity of light is given by the square of the amplitude and therefore, the expanse of the amplitude is larger than the expanse of the intensity. Therefore, generally, coherent illumination is lower in resolution limit.

However, even if the illuminating light is coherent, it is possible to enhance the resolution of the projected image when there is a phase difference between the lights from the adjacent reflecting portions. FIG. 7 of the accompanying drawings shows the intensity distributions of light in the projected image when two point light sources are at the distance of Rayleigh's resolution limit. In FIG. 7, an intensity distribution a refers to a case where the light sources are incoherent, an intensity distribution b refers to a case where the light sources are coherent and their phases are coincident with each other, and an intensity distribution c refers to a case where the light sources are coherent and are 180° out of phase with each other. Thus, it will be seen that even in the case of coherent illumination which usually is low in resolution limit, resolution takes place much better than in the case of incoherent illumination if the light sources are 180° out of phase with each other.

The present invention pays attention to the fact that like this, resolution is enhanced in the case of coherent illumination in which light sources are 180° out of phase with each other, and enhances resolution by providing phase shifting means for shifting the phase between adjacent reflecting portions (corresponding to the point light sources) through a non-reflecting portion.

That is, the reflection mask for X ray according to the present invention has a predetermined pattern formed by reflecting portions comprising multilayer film and a non-reflecting portion, is used with coherent reflected illumination (X ray), and is provided with phase shifting means on at least one of the reflecting portions on the opposite sides of the non-reflecting portion such that a phase difference is generated between the lights from these reflecting portions.

As described above, if the reflection mask for X ray according to the present invention is used, the resolution limit of the projected image can be markedly enhanced while use is made of the same projection mirror as in the prior art and illuminating light by X ray of the same wavelength as in the prior art. Particularly in the printing or the like of minute patterns by an IC manufacturing apparatus or the like, the present invention is very effective when the spacing between the patterns is approximate to the resolution limit.

Also, where the projection mirror system cannot be made large due to the mechanical limitations or the like of a projection apparatus, it is difficult from the problem in aberration correction to make the numerical aperture of the mirror system great. However, the use of the reflection mask for X ray according to the present invention enables resolution higher than the resolution limit of the projection mirror to be obtained.

Further, the present invention can be used not only for a pattern surface printed on the reflection mask, but also for an alignment mark or the like, and can improve the accuracy of alignment.

DESCRIPTION OF THE PREFERRED EMBODIMENTS

The present invention will hereinafter be described with respect to some embodiments thereof, but the present invention is not restricted thereto.

EXAMPLE 1

Figure 1:
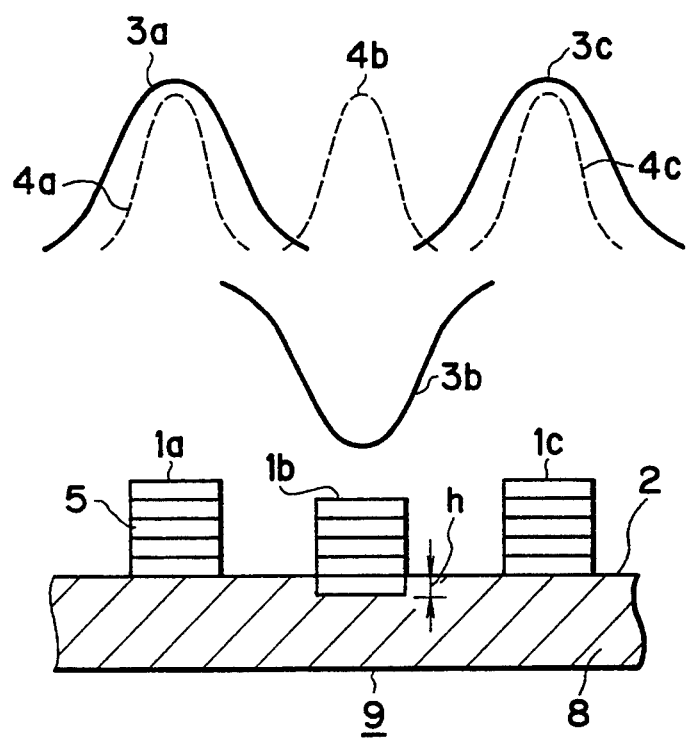
FIG. 1 shows a schematic cross-section of a reflection mask for X ray according to a first embodiment of the present invention and the amplitude distribution and intensity distribution of the image of the reflection mask as it is projected by coherent illumination by X ray.

FIG. 1 is a schematic cross-sectional view of a reflection mask for X ray according to a first embodiment of the present invention. FIG. 1 also shows the amplitude distribution and intensity distribution of the projected image of this reflection mask when coherent illuminating light having a wavelength of the soft X ray range is made to be incident on the mask.

The reflection mask 9 has multilayer film 5 which provides reflecting portions formed on a base plate 8 in accordance with a predetermined pattern shape. Three such reflecting portions designated 1a–1c are seen in FIG. 1. During the making of the reflection mask 9, before a pattern is formed on the base plate 8, a level difference is provided on the base plate 8 at a location for shifting the phase in the reflecting portions (in the figure, the location corresponding to 1b between 1a and 1c) by the use of a method such as etching. When the wavelength of illuminating light used is $\lambda$, the amount h of this level difference is $h = \lambda/4$. Thereafter, multilayer film 5 is formed on each of the reflecting portions. The multilayer film 5 may be formed with the same number of layers in each reflecting portion independently of the presence of the level difference. That is, in FIG. 1, 1a and 1c constitute reflecting portions for imparting a reference phase, and 1b constitutes a reflecting portion for imparting a phase difference of 180°.

In the soft X ray range, the reflectances of ordinary substances are very small and almost all of light is absorbed thereby and therefore, it is not necessary to apply any special working to a non-reflecting portion 2. For example, before the multilayer film is formed, masking may be done, or after the multilayer film is formed, any unnecessary portion may be removed as by etching. In the present embodiment, the base plate 8 itself forms the non-reflecting portion 2, and a predetermined pattern is formed by the non-reflecting portion 2 and the reflecting portions 1.

In the projected image of the reflection mask according to the present embodiment, the amplitude distributions 3a and 3c of the images from the reflecting portions 1a and 1c of the three reflecting portions 1a, 1b and 1c which impart said reference phase are the same as in the prior art. However, the image of the reflecting portion 1b formed on the level difference portion which imparts a phase difference of 180° is inverted in amplitude by the level difference as shown by 3b.

In the present embodiment, the level difference is formed so that the reflecting portion 1b may be lower than the reflecting portions 1a and 1c, but conversely, it may be formed so that the reflecting portion 1b may be higher than the reflecting portions 1a and 1c.

Also, as the multilayer film, use can be made of a combination of molybdenum/silicon or tungsten/carbon. For example, where the reflection mask is irradiated with X ray of a wavelength 13 nm, use can be made of multilayer film comprising fifty pairs of molybdenum and silicon films laminated.

EXAMPLE 2

Figure 2:
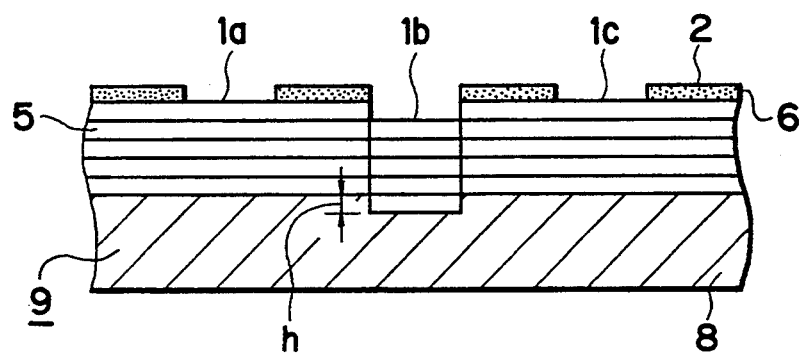
FIG. 2 is a schematic cross-sectional view of a reflection mask for X ray according to a second embodiment of the present invention.

FIG. 2 is a schematic cross-sectional view showing a second embodiment of the present invention. The reflection mask 9 of the present embodiment, like that of Example 1, is used in the soft X ray range.

In the reflection mask 9 of the present embodiment, multilayer film 5 itself formed on a base plate 8 provides reflecting portions 1, and light absorbing members 6 formed on the multilayer film 5 provide non-reflecting portions 2. The reflecting portion 1 and the non-reflecting portions 2 together form a predetermined pattern.

During the making of the mask 9, as in Example 1, a level difference of $h = \lambda/4$ is provided at a desired location on the base plate 8 (in FIG. 2, the reflecting portion 1b) by a method such as etching. Thereafter, the multilayer film 5 is formed on the base plate 8. The multilayer film 5 may be formed with the same number of layers independently of the presence of the level difference.

Also, a substance of great absorption coefficient can be chosen as the light absorbing members 6 in conformity with the wavelength of the light, but where the reflection mask is used with the illuminating light made to be incident vertically, use can be made of one of two substances constituting the multilayer film which is heavier.

In the projected image of the reflection mask of the present embodiment, as in Example 1, the amplitude distributions of the images from the reflecting portions 1a and 1c are the same as in the prior art. However, the image of the reflecting portion 1b formed on the level difference portion is inverted in amplitude by the level difference of $\lambda/4$. As a result, reflected lights arriving at regions corresponding to the non-reflecting portions are negated by each other and the light intensity becomes approximately 0 and thus, the resolution limit of the projected image is improved.

The non-reflecting portions may be formed by destroying the structure of the multilayer film. To destroy the structure of the multilayer film, there is a method of applying an ion beam to the film.

EXAMPLE 3

Figure 3:
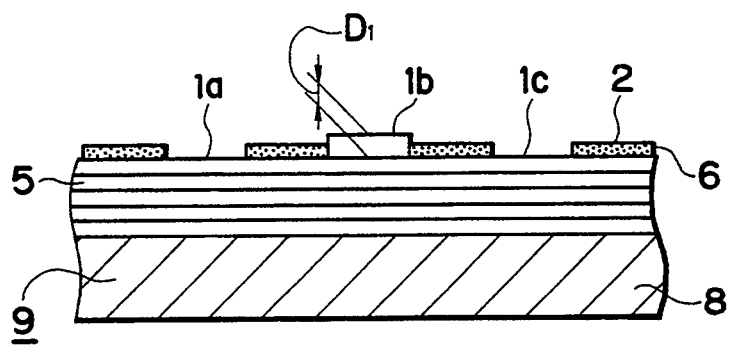
FIG. 3 is a schematic cross-sectional view of a reflection mask for X ray according to a third embodiment of the present invention.

FIG. 3 is a schematic cross-sectional view showing a third embodiment of the present invention. The reflection mask 9 of the present embodiment is formed with a level difference of λ/4 by changing the total thickness of multilayer film 5 which provides reflecting portion 1 formed on a base plate 8, instead of a level difference being provided on the base plate.

This mask 9, like the mask of Example 2, is such that the multilayer film 5 itself formed on the base plate 8 provides the reflecting portions 1 and light absorbing members 6 formed on the multilayer film 5 provide non-reflecting portions 2. The reflecting portions 1 and the non-reflecting portions 2 together form a predetermined pattern.

During the making of the mask 9, multilayer film 5 of a predetermined thickness (corresponding, for example, to reflecting portions 1a and 1c) was formed on the base plate 8, and then a level difference of λ/4 was provided by forming or etching multilayer film at a desired location (in FIG. 3, a reflecting portion 1b).

In the projected image of the reflection mask of the present embodiment, as in Example 1, the amplitude distributions of the images from the reflecting portions 1a and 1c become the same as in the prior art. However, the image of the reflecting portion 1b on the level difference portion is inverted in amplitude due to the level difference of λ/4. As a result, reflected lights arriving at region corresponding to the non-reflecting portions negate each other and the light intensity becomes approximately 0 and thus, the resolution limit of the projected image is improved.

Where the level difference is provided by film forming, the substance forming the film may be a substance distinct from the substance forming the multilayer film.

Also, the non-reflecting portions may be formed by destroying the structure of the multilayer film. To destroy the structure of the multilayer film, use can be made of a method of applying an ion beam to the film.

The relation between the thickness of the multilayer film and the wavelength of light, like the diffraction by crystal, is given by Bragg's law. That is, when the thickness of a pair of layers of the multilayer film is d and the wavelength of the illuminating light is λ and the angle of incidence of the light is $\alpha$, there is approximately given the following relation:

$$2d \cdot \cos \alpha = \lambda.$$

When the illuminating light is made to be incident vertically, $\alpha = 0°$ and therefore, in the present embodiment, the level difference of λ/4 and d/2 can become equal to each other. That is, to create a phase difference of 180°, the total thickness of the multilayer film can be varied by ½ of a pair of layers. Accordingly, when the amount of the level difference is D1, design can be made such that D1=d/2.

Generally, it is often the case with multilayer film that two substances are alternately laminated with the same degree of film thickness and therefore, if a substance is added by the same degree of thickness as that before, it will be possible to obtain an amount of variation in said total thickness. More strictly, depending on whether the substance of the outermost surface of the multilayer film (the surface on which the illuminating light is incident) is the same between the reflecting portions 1a, 1c and the reflecting portion 1b, there occurs a slight difference in the phase difference between the two or the reflectances of the two, but this difference can be adjusted by changing the thickness of the film formed.

EXAMPLE 4

Figure 4:
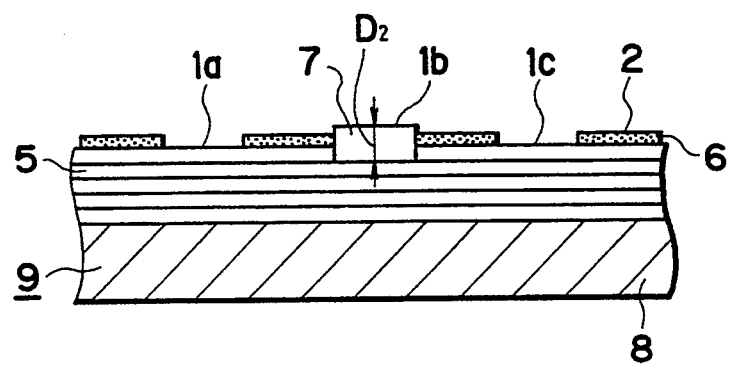
FIG. 4 is a schematic cross-sectional view of a reflection mask for X ray according to a fourth embodiment of the present invention.

FIG. 4 is a schematic cross-sectional view showing a fourth embodiment of the present invention. In the present embodiment, instead of providing a level difference on the base plate 8, by a method of oxidizing the outermost surface layer of the multilayer film, this layer is degenerated to construct reflecting portions having a level difference of λ/4.

This mask 9, like the mask of Example 2, is such that the multilayer film 5 itself formed on the base plate 8 constitutes reflecting portions 1 and light absorbing members 6 formed on the multilayer film 5 constitute non-reflecting portions 2. The reflecting portions 1 and the non-reflecting portions 2 together form a predetermined pattern.

During the making of the mask 9, multilayer film 5 having a predetermined thickness (corresponding to the reflecting portions 1a and 1c in FIG. 4) was formed on the base plate 8, and then oxidized film (degenerated film) 7 was formed at a desired location (for example, the reflecting portion 1b) by a method such as anode oxidization so as to provide a level difference of λ/4.

The non-reflecting portions 2 were formed by coating the multilayer film 5 with the light absorbing members 6. In this case, the non-reflecting portions may be formed by destroying the structure of the multilayer film. To destroy the structure of the multilayer film, there is a method of applying an ion beam to the film.

In the projected image of the reflection mask of the present embodiment, as in Example 1, the amplitude distributions of the images from the reflecting portions 1a and 1c become the same as in the prior art. As a result, reflected lights arriving at regions corresponding to the non-reflecting portions are negated by each other and the light intensity becomes approximately 0 and thus, the resolution limit of the projected image is improved.

The thickness D2 of the film varied by the formation of the degenerated film provides a level difference which is ½ of the thickness d of a pair of layers of the multilayer film. If this thickness is not obtained simply by degenerating the outermost surface layer of the multilayer film, the multilayer film may be degenerated over several layers. More strictly, the substance of the outermost surface of the multilayer film differs between the reflecting portions 1a and 1b and therefore, a slight difference occurs in the phase difference and reflectance, but this difference can be adjusted by changing the thickness to which the multilayer film is degenerated.

In Examples 1 to 4, as phase shifting means, provision is made of a level difference h corresponding to λ/4, where λ is the wavelength of the illuminating light used, so that the phase difference may be 180° with respect to the vertically incident light. More generally, however, when the angle of incidence of the light is $\alpha$, provision can be made of a level difference corresponding to $\lambda/(4 \cos \alpha)$.

In a wavelength range like soft X ray for which there is no suitable beam splitter for separating incident light and reflected light, the incident light and the reflected light are separated by slightly inclining the incident light. The amount of the level difference can be changed in accordance with the angle of incidence of the light.

Where this level difference is formed by the multilayer film or discrete film, the thickness thereof (corresponding to the level difference) can be d/2 with Bragg's law taken into account, as previously described.

Also, the reflection mask of the present invention may have not only a one-dimensional pattern, but also a two-dimensional pattern.

Further, the phase difference is not limited to 180°. For example, the images of two point light sources which are 90° out of phase with each other become the same resolution as in a case where the light sources are incoherent, and the resolving power becomes higher than coherent resolution free of any phase difference.

EXAMPLE 5

Figure 5:
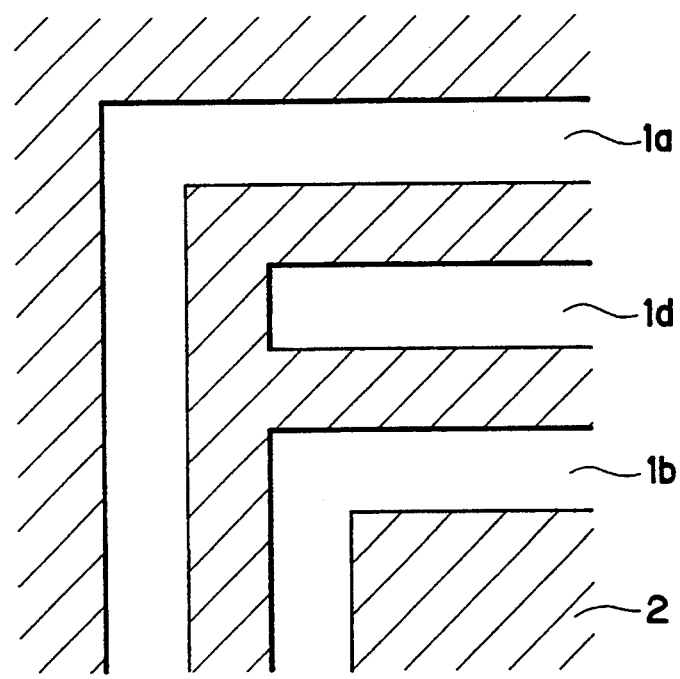
FIG. 5 is a schematic plan view of a reflection mask for X ray having a two-dimensional pattern according to a fifth embodiment of the present invention.
Figure 6:
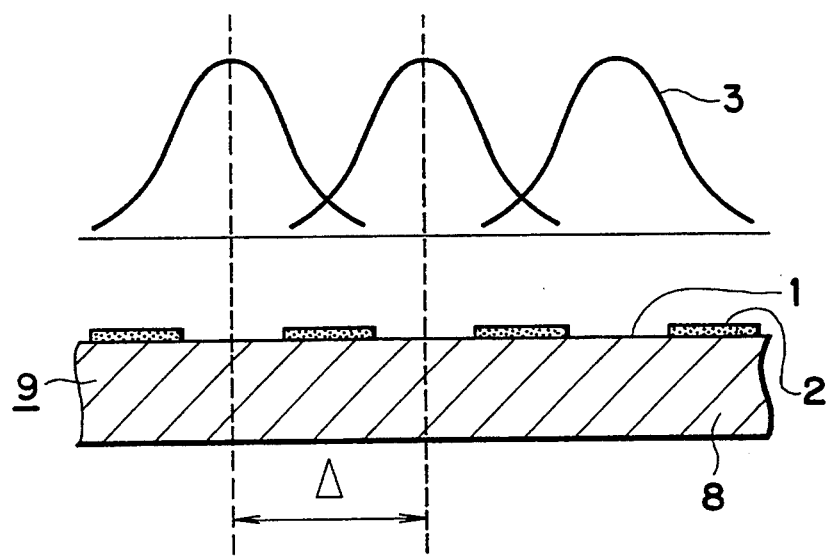
FIG. 6 shows a cross-section of a reflection mask for visible light according to the prior art and the amplitude distribution of the projected image of this reflection mask.
Figure 7:
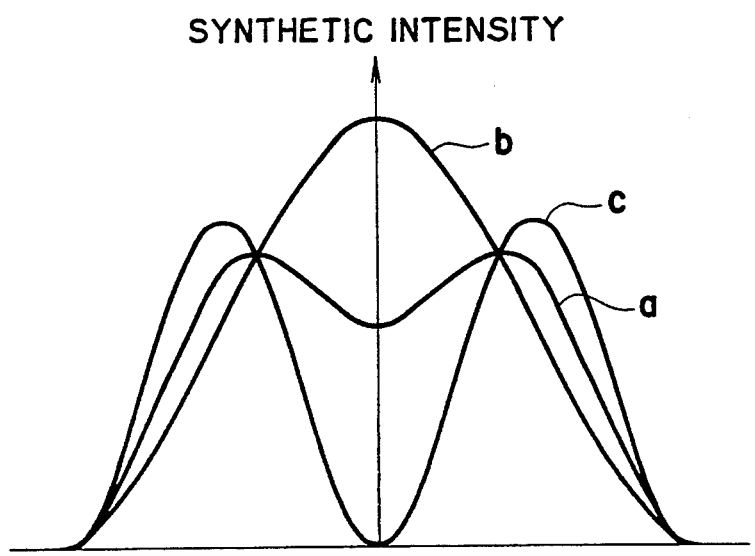
FIG. 7 shows the intensity distribution when two point light sources are at the distance of Rayleigh's resolution limit.

FIG. 5 is a schematic plan view showing a fifth embodiment of the present invention. Three reflecting portions 1a, 1b and 1d, together with a non-reflecting portion 2, form a two-dimensional pattern.

In the present embodiment, with the reflecting portion 1a as a reference, a level difference of $\lambda/4$ is provided on the reflecting portion 1b and a level difference of $\lambda/8$ is provided on the reflecting portion 1d. In a section wherein the three reflecting portions 1a, 1d and 1b are juxtaposed, the phase difference between adjacent reflecting portions is 90°. Also, in a section wherein the reflecting portions 1a and 1b are adjacent to each other, the phase difference is 180°. Accordingly, resolution can be enhanced over the substantially entire area of the pattern.

As described above, during the setting of the phase difference, it is preferable to select the phase difference appropriately in conformity with the pattern of the reflection mask.

The level differences provided in the present embodiment to create the phase differences of $\lambda/4$ and $\lambda/8$ can be formed by any of the methods indicated in the above-described Examples 1 to 4.

What is claimed is:

1. A reflection mask for X-ray, comprising:
   a substrate;
   an X-ray reflective multilayer film laminate disposed on said substrate and forming reflection portions of a predetermined pattern of reflection and non-reflection portions;
   an X-ray non-reflective film formed on said laminate in accordance with said predetermined pattern so as to form said non-reflection portions; and
   phase shifting means provided at one of two neighboring reflection portions at opposite sides of a non-reflection portion for generating a predetermined phase difference between reflected X-ray illumination from said one reflection portion and reflected X-ray illumination from the other of said two reflection portions.

2. A reflection mask for X-ray according to claim 1, wherein said phase shifting means provides a height difference between said one reflection portion and said other reflection portion relative to a surface of said substrate.

3. A reflection mask for X-ray according to claim 2, wherein the relation $h=\lambda/4$ is satisfied, where h is said height difference and $\lambda$ is the wavelength of the X-ray illumination.

4. A reflection mask for X-ray according to claim 2, wherein the relation $h=\lambda/(4\cos\alpha)$ is satisfied, where h is said height difference, $\lambda$ is the wavelength of the X-ray illumination, and $\alpha$ is the incident angle of the X-ray illumination.

5. A reflection mask for X-ray according to claim 2, wherein the relation $h=\lambda/8$ is satisfied, where h is said height difference and $\lambda$ is the wavelength of the X-ray illumination.

6. A reflection mask for X-ray according to claim 2, wherein said laminate has the same number of layers at said one reflection portion as at said other reflection portion.

7. A reflection mask for X-ray according to claim 1, wherein said phase shifting means is provided by a difference of film thickness of said laminate at said one reflection portion as compared with said other reflection portion.

8. A reflection mask for X-ray according to claim 7, wherein successive layers of said laminate are made of different materials, and the relation $D1=d/2$ is satisfied, where D1 and d are, respectively, said difference of film thickness and the thickness of a set of successive layers of number equal to the number of layer materials of said laminate.

9. A reflection mask for X-ray according to claim 1, wherein said phase shifting means comprises a transformed outermost layer of said laminate at said one reflection portion.

10. A reflection mask for X-ray according to claim 9, wherein successive layers of said laminate are made of different materials, and the thickness of said transformed layer provides a thickness difference d/2 of said laminate at said one reflection portion as compared with said other reflection portion, where d is the thickness of a set of successive layers of number equal to the number of layer materials of said laminate.

11. A reflection mask for X-ray according to claim 1, wherein said laminate comprises alternately laminated layers of molybdenum and silicon.

12. A reflection mask for X-ray according to claim 1, wherein said laminate comprises alternately laminated layers of tungsten and carbon.

13. A reflection mask for X-ray according to claim 1, wherein said multilayer film laminate reflects X-rays having wavelengths in about the range of 2–100 nm.

14. A reflection mask for X-ray, comprising:
   an X-ray non-reflective substrate forming non-reflection portions of a predetermined pattern of reflection portions and non-reflection portions;
   an X-ray reflective multilayer film laminate which is formed on said substrate in accordance with said predetermined pattern so as to form said reflection portions; and
   phase shifting means providing a height difference, relative to a surface of said substrate, between two reflection portions at opposite sides of a non-reflection portion for generating a predetermined phase difference between reflected X-ray illumination from one of said two reflection portions and reflected X-ray illumination from the other of said two reflection portions.

15. A reflection mask for X-ray according to claim 14, wherein said laminate comprises alternately laminated layers of molybdenum and silicon.

16. A reflection mask for X-ray according to claim 14, wherein said laminate comprises alternately laminated layers of tungsten and carbon.

17. A reflection mask for X-ray according to claim 15, wherein the relation $h=\lambda/4$ is satisfied, where h is said height difference and $\lambda$ is the wavelength of the X-ray illumination.

18. A reflection mask for X-ray according to claim 15, wherein the relation $h=\lambda/(4\cos\alpha)$ is satisfied, where h is said height difference, $\lambda$ is the wavelength of the X-ray illumination, and $\alpha$ is the incident angle of the X-ray illumination.

19. A reflection mask for X-ray according to claim 15, wherein the relation $h=\lambda/8$ is satisfied, where h is said height difference and $\lambda$ is the wavelength of the X-ray illumination.

20. A reflection mask for X-ray according to claim 14, wherein said multilayer film laminate reflects X-rays having wavelengths in about the range of 2–100 nm.

* * * * *